United States Patent
Okuuchi

(10) Patent No.: US 8,883,543 B2
(45) Date of Patent: Nov. 11, 2014

(54) METHOD OF PRODUCING WAFER FOR SOLAR CELL, METHOD OF PRODUCING SOLAR CELL, AND METHOD OF PRODUCING SOLAR CELL MODULE

(75) Inventor: Shigeru Okuuchi, Minato-ku (JP)

(73) Assignee: SUMCO Corporation, Minato-ku (JP)

( * ) Notice: Subject to any disclaimer, the term of this patent is extended or adjusted under 35 U.S.C. 154(b) by 0 days.

(21) Appl. No.: 14/006,563

(22) PCT Filed: Apr. 5, 2012

(86) PCT No.: PCT/JP2012/002398
§ 371 (c)(1),
(2), (4) Date: Sep. 20, 2013

(87) PCT Pub. No.: WO2012/157179
PCT Pub. Date: Nov. 22, 2012

(65) Prior Publication Data
US 2014/0057383 A1    Feb. 27, 2014

(30) Foreign Application Priority Data

May 17, 2011 (JP) ................. 2011-110400
Jul. 25, 2011 (JP) ................. 2011-162424
Jan. 12, 2012 (JP) ................. 2012-004034

(51) Int. Cl.
*H01L 51/40* (2006.01)
*H01L 31/0236* (2006.01)
*H01L 31/0216* (2014.01)

(52) U.S. Cl.
CPC .... *H01L 31/02363* (2013.01); *H01L 31/02168* (2013.01); *Y02E 10/52* (2013.01)
USPC ............... 438/71; 438/45; 438/409; 438/565; 257/E25.007; 257/E27.124

(58) Field of Classification Search
CPC ...................................................... H01L 31/00
USPC ................... 257/E25.007, E27.124, E21.135; 438/45, 71, 409, 565, 665, 689, 753
See application file for complete search history.

(56) References Cited

FOREIGN PATENT DOCUMENTS

| JP | 6-169097 A | 6/1994 |
|---|---|---|
| JP | 2005-183505 A | 7/2005 |

(Continued)

OTHER PUBLICATIONS

International Search Report mailed May 15, 2012, issued in corresponding International Application No. PCT/JP2012/002398, filed Apr. 5, 2012, 4 pages.

(Continued)

*Primary Examiner* — Mark A Laurenzi
(74) *Attorney, Agent, or Firm* — Christensen O'Connor Johnson Kindness PLLC

(57) ABSTRACT

Provided is a method of producing a wafer for a solar cell that can produce the solar cell with high conversion efficiency.
A method of producing a wafer for a solar cell according to the present invention comprises a first step of contacting lower alcohol to at least one surface of the semiconductor wafer and a second step, after the first step, of contacting hydrofluoric acid containing metal ion to the at least one surface of the semiconductor wafer, and a third step that is, after the second step, a step of contacting alkali solution to the at least one surface of the semiconductor wafer, a step of contacting acid solution containing hydrofluoric acid and nitric acid to the at least one surface of the semiconductor wafer, or a step of carrying out an oxidation treatment to the at least one surface of the semiconductor wafer.

16 Claims, 4 Drawing Sheets

(56) References Cited

FOREIGN PATENT DOCUMENTS

| | | |
|---|---|---|
| JP | 2005-277208 A | 10/2005 |
| JP | 2007-194485 A | 8/2007 |
| JP | 2009-524264 A | 6/2009 |
| TW | 201031009 A1 | 8/2010 |
| WO | 2007/083152 A1 | 7/2007 |
| WO | 2009/054076 A1 | 4/2009 |

OTHER PUBLICATIONS

Preliminary Notice of First Office Action mailed May 23, 2014, issued in corresponding Taiwanese Patent Application No. 101114776, filed Apr. 25, 2012, 8 pages.

FIG. 2
(a)
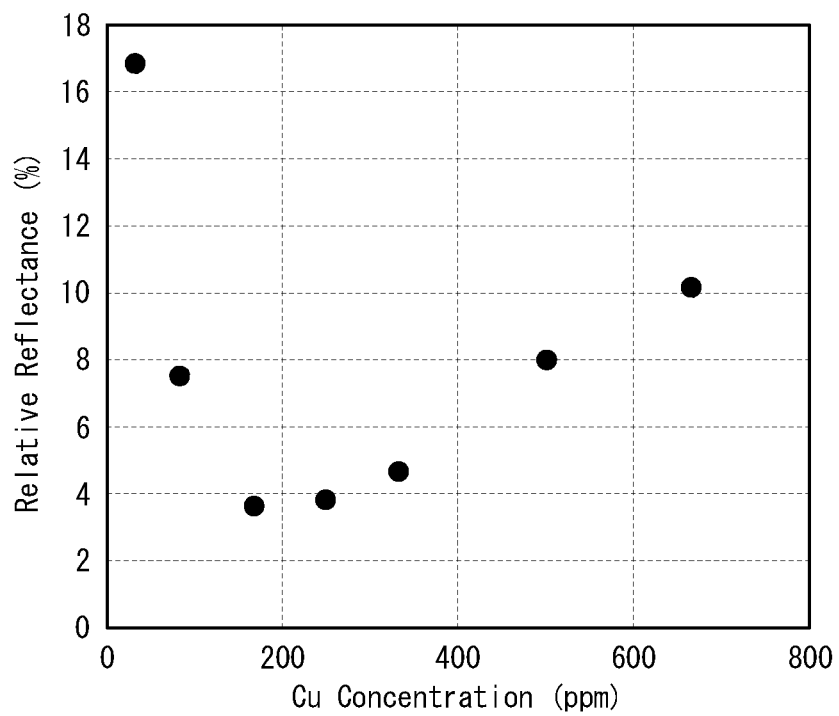
(b)
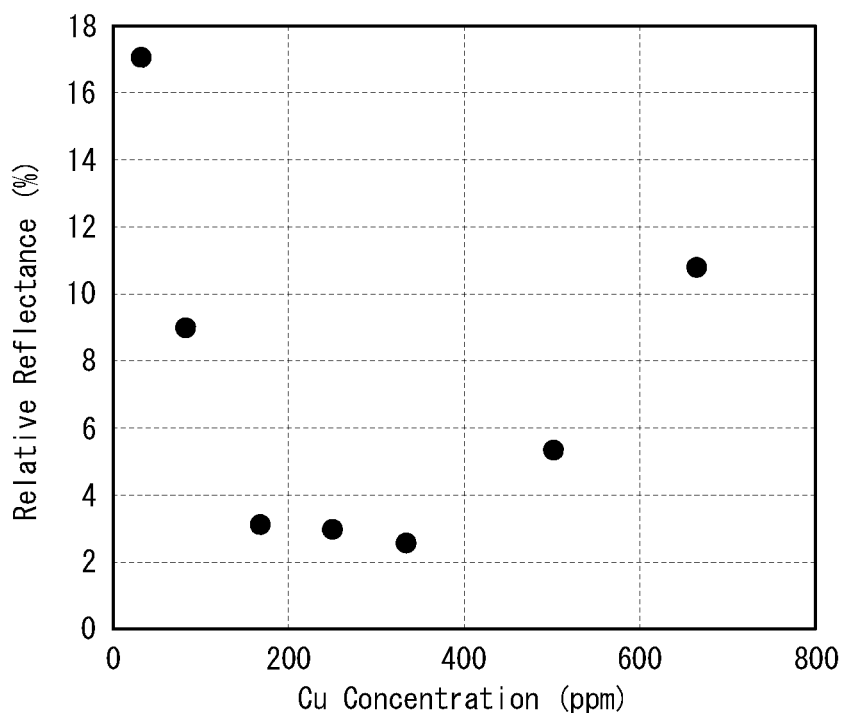

FIG. 4
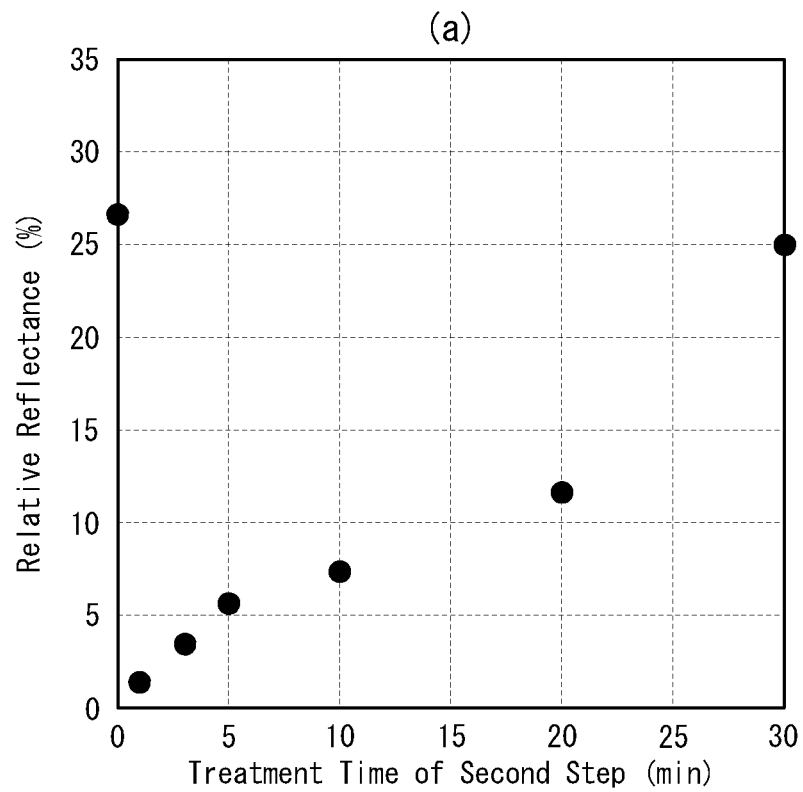
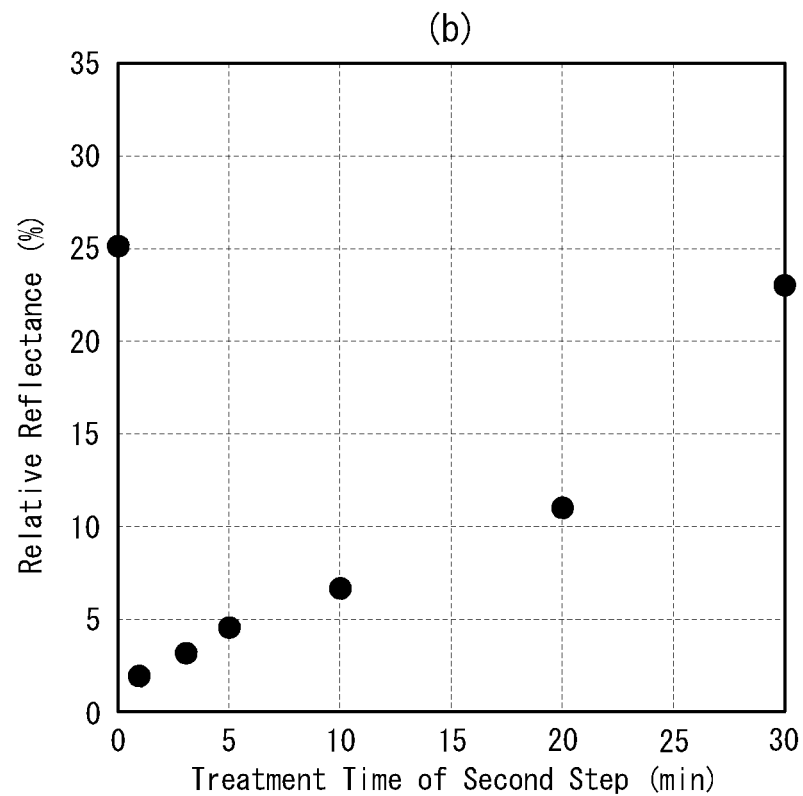

METHOD OF PRODUCING WAFER FOR SOLAR CELL, METHOD OF PRODUCING SOLAR CELL, AND METHOD OF PRODUCING SOLAR CELL MODULE

TECHNICAL FIELD

The present invention relates to a method of producing a wafer for a solar cell, a method of producing a solar cell, and a method of producing a solar cell module. In particular, the present invention relates to, for the purpose of producing a solar cell with high conversion efficiency, a method of producing a wafer for the solar cell by making a surface of a semiconductor wafer porous.

BACKGROUND ART

In general, a solar cell is formed using a semiconductor wafer including a silicon wafer. In order to improve conversion efficiency of the solar cell, it is necessary to reduce the light that reflects on a light receiving surface of the solar cell and the light that passes through the solar cell. Here, for example, in preparing a crystalline solar cell by using the silicon wafer, since the silicon wafer has a low transmittance of visible light contributing to photoelectric conversion, in order to improve the conversion efficiency, it is necessary to consider only reducing reflection loss of the visible light on the silicon wafer surface acting as the light receiving surface, thereby effectively capturing incident light within the solar cell.

As a technique for reducing the reflection loss of the incident light on the silicon wafer surface, there are a technique to form an antireflection film on the surface and a technique to form, in the surface, an uneven structure such as micro-sized pyramidal unevenness called a textured structure. As for the latter technique, the method of forming the textured structure in the surface is suitable for single crystal silicon and represented by a method of etching a surface (100) of single crystal silicon with alkali solution. The etching using alkali leverages that an etching rate of a surface (111) is slower than that of the surface (100) and a surface (110). Further, as the latter technique, in recent years there is suggested a method, by making a silicon surface porous, of forming the uneven structure in the surface to reduce the reflection loss of the incident light.

For example, Patent Document 1 describes a method, by an anodization process that passes an electric current in hydrofluoric acid using a single crystal silicon substrate as an anode and Pt as a cathode, of forming numerous fine holes in the surface.

Further, Patent Document 2 describes a technique, in order to form finer sub-micron order unevenness on micron-sized texture structure formed in a surface of a silicon substrate, of carrying out electroless plating of the surface with metal particles and then etching the substrate in mixed solution of an oxidizing agent and hydrofluoric acid. Specifically, an alkali textured p-type single crystal silicon substrate is immersed in solution containing silver perchlorate and sodium hydroxide, such that silver particles are formed on the surface. Then, the silicon substrate is immersed in mixed solution of hydrogen peroxide water, hydrofluoric acid and the water, to form sub-micron order unevenness.

RELATED ART DOCUMENTS

Patent Documents

Patent Document 1: Japanese Patent Laid-Open No. 6-169097
Patent Document 2: Japanese Patent Laid-Open No. 2007-194485

SUMMARY OF INVENTION

Technical Problem

According to the method using the anodization process of Patent Document 1, however, as described in the embodiment that a thickness of a porous layer is 50 μm or 25 μm, since a porous layer having significantly large holes is formed in the surface of the substrate, an effect of reducing the reflection loss of the incident light is insufficient. In order to obtain a solar cell with higher conversion efficiency, it is necessary to form finer holes in the surface of the substrate to further reduce a reflectance of the incident light.

According to the method described in Patent Document 2, on the other hand, a porous layer having relatively fine holes is formed. However, this patent document considers only reducing the reflectance of the incident light on the surface of the silicon wafer and no study is made for actual conversion efficiency of the solar cell made from the wafer.

Like Patent Document 2, the reality is that many porous techniques known so far have been studying mainly in terms of lowering the reflectance of the incident light on the surface of the silicon wafer as much as possible, leaving actual conversion efficiency of the solar cell made from those wafers yet to be studied.

However, the present inventor has studied and found that, when a porous degree of a wafer surface is greater, that is, when a porous layer having finer holes is formed, the surface of the solar cell is more excellent in reducing the reflectance, although in some cases the conversion efficiency of the solar cell does not increase so much.

Therefore, in consideration of the above problem, an object of the present invention is to provide a method of producing a wafer for a solar cell at a surface of which the reflectance of the incident light can be sufficiently reduced and from which a solar cell with higher conversion efficiency can be obtained, by making a surface of a semiconductor wafer including a silicon wafer porous. Another object of the present invention is to provide a method of producing a solar cell including the above method and a method of producing the solar cell module.

Solution to Problem

In order to achieve the above object, as a result of the present inventor's extensive studies and repeated trial and error of a porous treatment method in various manners, it has been found that, according to the method described below, submicron order unevenness is formed in a surface of a semiconductor wafer, so that reflection loss of light on the surface is effectively reduced, and conversion efficiency of a solar cell made from the wafer can increase. Thus, the present invention is accomplished. The present invention is based on the findings and the studies described above, and a summary and configuration thereof are described as follows.

A method of producing a wafer for a solar cell according to the present invention comprises a first step of contacting lower alcohol to at least one surface of a semiconductor wafer; and a second step, after the first step, of contacting hydrofluoric acid containing metal ion to the at least one surface of the semiconductor wafer, thereby the at least one surface of the semiconductor wafer is made porous; and a third step that is, after the second step, a step of contacting alkali solution to the at least one surface of the semiconductor wafer, a step of contacting acid solution containing hydrofluoric acid and nitric acid to the at least one surface of the semiconductor wafer, or a step of carrying out an oxidation treatment to the at least one surface of the semiconductor wafer.

According to the present invention, the semiconductor wafer is preferably a silicon wafer, and the metal ion is preferably an ion of metal nobler than Si.

According to the present invention, after the second step and before the third step, there is preferably a step of contacting, to the at least one surface of the semiconductor wafer, solution that removes metal deposited from the metal ion from the one surface.

According to the present invention, when contacting the alkali solution or the acid solution at the third step, a thickness of a porous layer formed in the one surface is preferably 50 to 400 nm.

According to the present invention, pH of the alkali solution used at the third step is preferably 9.0 to 14.0.

According to the present invention, a time of contacting the alkali solution at the third step is preferably 600 seconds or less.

According to the present invention, in the acid solution, concentration of the hydrofluoric acid is preferably 0.1 to 5.0 mass % and concentration of the nitric acid is preferably 20 to 50 mass %.

According to the present invention, a time of contacting the acid solution at the third step is preferably 10 minutes or less.

According to the present invention, the oxidation treatment is preferably a treatment of contacting solution containing an oxidant to the at least one surface of the semiconductor wafer.

According to the present invention, the oxidation treatment is preferably a heat treatment to the at least one surface of the semiconductor wafer in an atmosphere containing oxygen.

According to the present invention, the oxidation treatment is preferably a treatment to form an oxide film on the at least one surface of the semiconductor wafer by a liquid phase growth method.

A method of producing a solar cell according to the present invention, in addition to the steps of the method of producing the wafer for the solar cell described above, further includes a step of producing a solar cell from the wafer for the solar cell.

A method of producing a solar cell module according to the present invention, in addition to the steps of the method of producing the solar cell described above, further includes a step of producing a solar cell module from the solar cell.

EFFECT OF THE INVENTION

According to the present invention, a wafer surface is made fine porous and thereby reflectance of incident light on the wafer surface is sufficiently reduced and, further, a solar cell with higher conversion efficiency can be produced by using the obtained wafer for the solar cell.

BRIEF DESCRIPTION OF DRAWINGS

FIG. 2 illustrates graphs indicating, in Reference Example 3 of the present invention, a relationship between concentration of Cu at a second step and a relative reflectance of a silicon wafer surface: FIG. 2(a) has a vertical axis indicating a relative reflectance at a wavelength of 600 nm, and FIG. 2(b) has a vertical axis indicating a relative reflectance at a wavelength of 700 nm; FIG. 3(a) has a vertical axis indicating a relative reflectance at a wavelength of 600 nm, and FIG. 3(b) has a vertical axis indicating a relative reflectance at a wavelength of 700 nm; and FIG. 4 illustrates graphs indicating, in Reference Example 5 of the present invention, a relationship between a processing time at a second step and a relative reflectance of a silicon wafer surface: FIG. 4(a) has the vertical axis indicating a relative reflectance at a wavelength of 600 nm, and FIG. 4(b) has the vertical axis indicating a relative reflectance at a wavelength of 700 nm.

DESCRIPTION OF EMBODIMENTS

Figure 1:
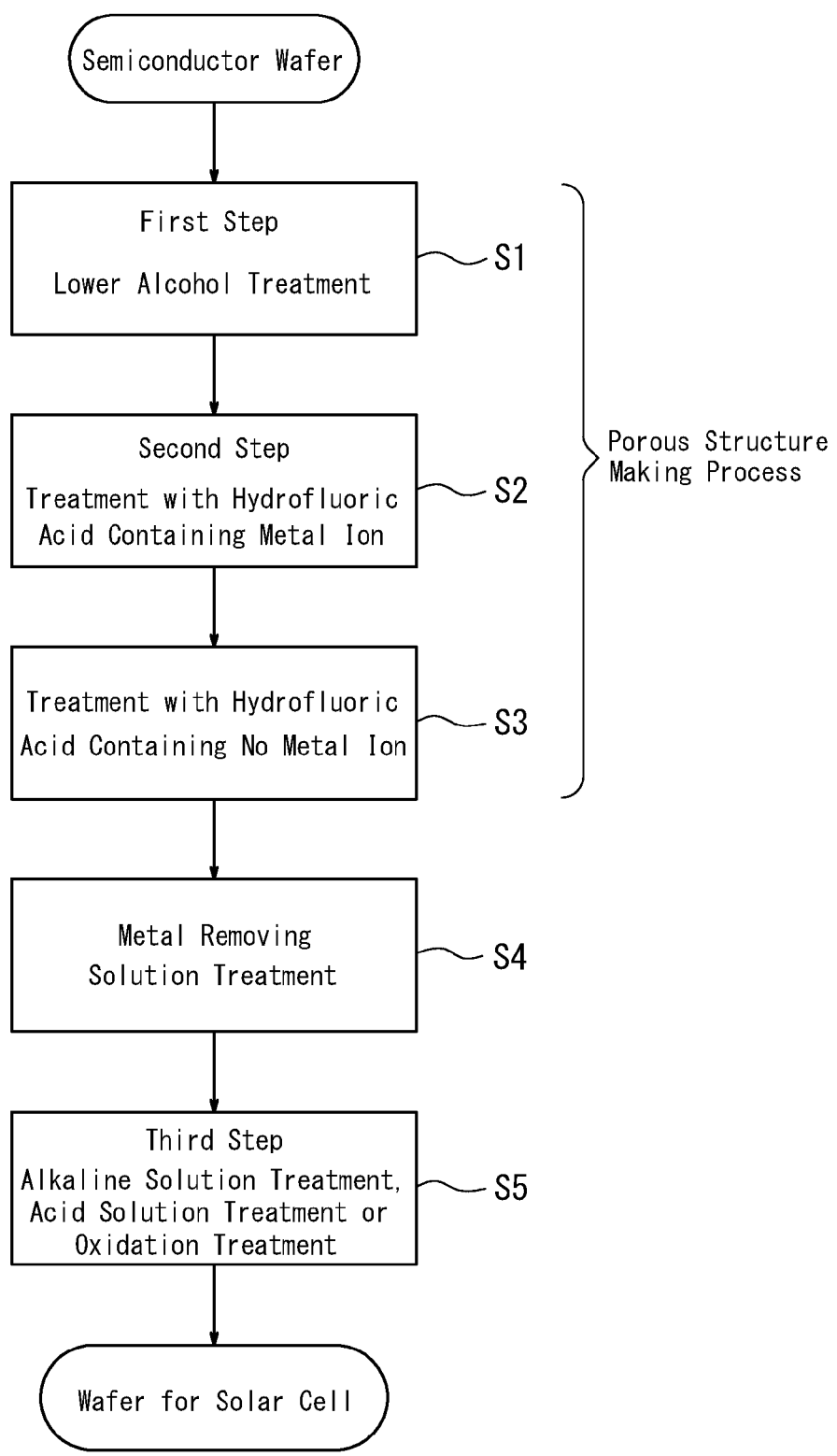
FIG. 1 is a flowchart of a typical method of producing a wafer for a solar cell according to the present invention.

The present invention will be described in more detail, with reference to the accompanying drawings. FIG. 1 is a flowchart of a typical method for producing a wafer for a solar cell according to the present invention. First, although a semiconductor wafer used in the present invention is not particularly limited, in the following description, as one embodiment of the present invention, a single crystal silicon wafer or a polycrystalline silicon wafer (hereinafter, referred to as the "wafer", collectively) is used and subjected to a porous treatment to produce a wafer for a single crystal silicon solar cell or a polycrystalline silicon solar cell.

As the single crystal silicon wafer, a slice of a single crystal silicon ingot, grown by a Czochralski method (CZ method) or the like and cut with a wire saw or the like, may be used. A plane orientation of a wafer surface may be selected from (100), (001) and (111), as necessary. The polycrystalline silicon wafer may be obtained by slicing a polycrystalline silicon ingot.

For either the single crystal silicon wafer or the polycrystalline silicon wafer, the surface of the wafer cut out from the ingot is damaged by the slicing, such as cracks or crystal distortion introduced into a silicon layer. Therefore, it is preferable, after the slicing, to wash the wafer and process the wafer surface with an etching treatment using alkali or acid to remove the damaged surface. A penetration depth of the damage caused by the slicing is a factor determined by slicing conditions and, typically, 10 μm or less. Therefore, a generally performed etching treatment using alkali such as KOH or acid mixture of hydrofluoric acid (HF)/nitric acid ($HNO_3$) can deal with the damage.

The present invention is a method of producing the wafer for the solar cell by making at least one surface of the wafer porous. That is, "the wafer for the solar cell" in the present specification is intended to mean a wafer having at least one surface having been subjected to a treatment specified by the present invention and thereby having been made porous. The one surface acts as a light receiving surface of the solar cell. Characteristic steps of the present invention includes a first step (step S1) of contacting lower alcohol solution to at least one surface of the wafer, a second step (step S2), after the first step, of contacting hydrofluoric acid containing metal ion to the at least one surface of the wafer, and a third step (step S5) that is, after the second step, a step of contacting alkali solution to the at least one surface of the semiconductor wafer, a step of contacting acid solution containing hydrofluoric acid and nitric acid to the at least one surface of the semiconductor wafer, or a step of carrying out an oxidation treatment to the at least one surface of the semiconductor wafer.

The following is a description of technical significance of adopting the characteristic steps of the present invention set forth above, together with operational effects, by using specific examples. Although a detailed process will be described in the examples below, the present inventor, after carrying out an acid-etching treatment, immersed an air-dried p-type (100) single crystal silicon wafer in lower alcohol such as 2-propanol (isopropyl alcohol; IPA) for a predetermined time and then in hydrofluoric acid containing dissolved copper (Cu) for a predetermined time, thereby found that the wafer surface turned black and reflectance at each of the wavelengths of an entire visible light range has decreased. Further, when an image of the wafer surface was observed by a scanning electron microscope (SEM), numerical finer unevenness was further formed on approximately several μm of an uneven surface.

Further, conventional porous techniques have been studying to reduce the reflectance as a main object and considering that the conversion efficiency of the solar cell increases naturally as the reflectance is lower. According to the studies by the present inventor, however, it was found that, although the wafer surface having a greater porous degree is more excellent in reducing the reflectance of the surface of the solar cell, regardless of a progression of a porous degree to some extent by the above treatment of the present invention, the conversion efficiency of the solar cell does not increase so much despite the low reflectance.

As a reason for not being able to obtain conversion efficiency as high as expected from the low reflectance, it is considered that a surface recombination phenomenon in which electrons are trapped in the fine porous structure on the surface of the wafer for the solar cell occurs frequently, causing a phenomenon to reduce the electrons that can be externally taken out. That is, Si atoms present in the wafer surface have, at a constant rate, dangling bonds (unsaturated bond portions) that act as capture points for electrons obtained from incident light or holes (a surface recombination phenomenon of carrier components). When the porous structure is finer, an area of the wafer surface is increased, as a result also increasing the number of dangling bonds, thereby the surface recombination phenomenon occurs more frequently. Therefore, it is supposed that conversion efficiency as high as expected was not obtained.

As such, in addition to the porous treatment including the first and second steps described above, an alkali solution treatment step or a predetermined acid solution treatment step was added, thereby the porous structure was lightly etched such that the porous layer of the wafer surface was slightly scraped down. Then, it was found that the conversion efficiency was improved.

Alternatively, after the porous treatment including the first and second steps described above, the porous wafer surface was subjected to the oxidation treatment, thereby it was found that the conversion efficiency of a solar cell produced from this wafer was improved. It is believed that the oxidation treatment to the dangling bonds can extinguish recombination centers. Note that, since the oxidation treatment has none or only a little etching effect to the wafer surface, the unevenness of the wafer surface is either hardly changed or not changed at all. Therefore, the reflectance of the wafer surface can remain as low as it is before the oxidation treatment, which is also favorable.

Based on the above findings, the present inventor has accomplished the present invention.

Although the reason why the surface treatment of the first and second steps can make the wafer surface porous is not necessarily clear, the present inventor estimates that the surface has been caused porous by reaction mechanism described as follows. At the second step, when the wafer is immersed in hydrofluoric acid containing dissolved Cu, from some nuclei of the wafer surface as a base, Cu is deposited as many fine particles. This is a reduction reaction of $Cu^{2+}+2e^- \rightarrow Cu$ and, due to charge transfer at this time, electrons are deprived from Si of the wafer surface, generating dissolution of Si at the positions where the Cu particles are deposited. Here, as a role of hydrofluoric acid, there are presumably a model to instantaneously dissolve $SiO_2$ each time it is generated when Si reacts with the water at a soluble portion of Si and thereby making the porous structure (Omi model), and a model in which fluorine ions directly oxidize Si (Chemla model). Details of such reactions are described in J. Electrochem. Soc. 144, 3275 (1997) "The Role of Metal Induced Oxidation for Copper Deposition on Silicon Surface", and in J. Electrochem. Soc. 144, 4175 (1997) "Electrochemical and radiochemical study of copper contamination mechanism from HF solution onto silicon substrates". According to the present invention, it is considered that the treatment with lower alcohol, which is nonpolar solvent, at the first step can control a surface potential of the wafer surface and facilitate progression of metal deposition at the time of immersion in hydrofluoric acid, thereby promoting a uniform Si dissolution reaction at the second step. Further, it is also considered that the treatment with lower alcohol works to remove organic materials on the wafer surface and facilitates progression of the reaction described above.

According to the present invention, selection of the step of contacting alkali solution or the step of contacting acid solution containing hydrofluoric acid and nitric acid eliminates the necessity for large-scale devices such as a DC power supply and an ion implantation apparatus, as well as the necessity for mixing hydrofluoric acid with organic solvent or for using an oxidant together with hydrofluoric acid. Therefore, it has become possible, in a safer and inexpensive manner comparing to conventional techniques, to make the surface of the semiconductor wafer including the silicon wafer porous, and thereby to obtain the wafer for the solar cell with reduced reflection loss of light on the surface. Also, since the porous degree is somewhat reduced at the third step, surface recombination is suppressed and a solar cell with high conversion efficiency can be produced.

Further, selection of the oxidation treatment to the semiconductor wafer as the third step can suppress the surface recombination phenomenon without changing the unevenness of the wafer surface, thereby producing a solar cell with higher conversion efficiency by using the obtained wafer for the solar cell.

According to the present embodiment, after the second step and before the third step, it is preferable to further carry out a step (step S3) of contacting hydrofluoric acid containing no metal ions to the at least one surface of the wafer. Specifically, after the second step, the wafer may be immersed in hydrofluoric acid containing no metal ions for a predetermined time. This step can control, to some extent, a depth of the unevenness of the surface formed at the second step.

Preferably, the second step and/or the step S3 is carried out under a light-irradiating environment. This is because carrying out the second step under the light-irradiating environment more promotes porous formation in the surface by the reaction mechanism described above. It is also because carrying out the step S3 under the light-irradiating environment and controlling irradiation conditions can make the wafer surface a desired porous surface. The light-irradiating environment may be made by, in particular, emitting fluorescent light, halogen light or the like to a reaction surface.

Also, at least after the second step and, according to the present embodiment, before the third step, it is preferable to further carry out a step of contacting, to the at least one surface of the wafer, solution for removing metal (fine particles) deposited from the metal ions from the one surface (step S4). For example, when using hydrofluoric acid containing dissolved Cu at the second step, nitric acid solution is contacted to the surface to remove Cu particles remaining on the one surface. This step can remove metal particles remained adhering to the wafer surface.

Then, after the above steps, a step of contacting the alkali solution to the at least one surface of the wafer, a step of contacting the acid solution containing hydrofluoric acid and nitric acid to the at least one surface of the wafer, or a step of carrying out the oxidation treatment to the at least one surface of the wafer (step S5) is further carried out.

According to the present embodiment, the wafer having a porous surface for the solar cell is produced through the above steps. The following is a description of a preferred mode of each step. A combination of the lower alcohol treatment at the first step, the metal-ion-containing hydrofluoric acid treatment at the second step and, preferably, the metal-ion-free hydrofluoric acid treatment at step S3 is referred to as a "porous structure making process" herein.

(First Step: Lower Alcohol Treatment)

The term "lower alcohol" means any linear alcohol or branched alcohol having 10 or less of carbon atoms herein. When the number of carbon atoms exceeds 10, viscosity of the alcohol is increased and therefore the wafer surface is coated with alcohol. When the number of carbon atoms is 10 or less, the alcohol can act as a low viscosity non-polar solvent to make the wafer surface a non-polar state. Although such alcohol may be typically methanol, ethanol, 2-propanol, N-methylpyrrolidone, ethylene glycol, glycerin, benzyl alcohol, and phenyl alcohol, considering toxicity and prices, ethanol and 2-propanol (isopropyl alcohol; IPA) are preferably used. Although a treatment time, that is, a time of contacting the lower alcohol to the wafer (hereinafter, the time to contact a treatment solution at each step is referred to as the "treatment time") is not particularly limited, it is preferably 0.5 minutes to 10 minutes, more preferably 3 minutes or less. This is because, when the treatment time is 0.5 minutes or more, a sufficient effect of reducing the reflectance according to the present invention can be obtained, while the effect of reducing the reflectance is saturated when the treatment time exceeds 10 minutes. Temperature of the lower alcohol does not matter as long as the alcohol is not evaporated or solidified, and may be at room temperature.

(Second Step: Treatment with Hydrofluoric Acid Containing Metal Ion)

According to the present embodiment, the metal ion is preferably an ion of metal nobler than Si such as, for example, Cu, Ag, Pt, and Au. Thereby, at the second step, deposition of fine particles of the metal on the wafer surface and dissolution of Si can occur efficiently. Considering the price, the ion of Cu is preferably used. The following is preferred conditions in terms of obtaining a sufficient effect of reducing the reflectance according to the present invention. In the hydrofluoric acid containing metal dissolved therein, concentration of the metal is preferably 10 ppm to 1000 ppm, more preferably 100 ppm to 400 ppm. Also, concentration of hydrofluoric acid is preferably 2 mass % to 50 mass %, more preferably 10 mass % to 40 mass %, further preferably 20 mass % to 30 mass %. The treatment time is preferably 0.5 minutes to 30 minutes, more preferably 1 minute to 10 minutes, further preferably 3 minutes or less. Temperature of the metal-containing hydrofluoric acid may be appropriately selected considering the treatment time and evaporation loss, and preferably set to room temperature to 100° C.

(Metal-ion-free Hydrofluoric Acid Treatment)

According to the present embodiment, in order to extend the porous layer formed in the wafer surface to an appropriate depth, concentration of hydrofluoric acid is preferably 2 mass % to 50 mass %, more preferably 20 mass % to 30 mass %. In the present specification, the "metal-ion-free hydrofluoric acid" includes hydrofluoric acid containing less than 10 ppm of metal as an impurity, as well as hydrofluoric acid in which a metal ion content is exactly zero. For example, when less than 10 ppm of ions of the metal such as Cu, Ag, Pt and Au that are nobler than Si is contained, a reaction which deepens the unevenness already formed at the second step becomes dominant over deposition of the metal particles, without formation of new unevenness on the wafer surface. The treatment time may be set in accordance with a process tact time, and preferably 0.5 minutes to 60 minutes. Temperature of the metal-ion-free hydrofluoric acid may be appropriately selected considering the treatment time and the evaporation loss, and preferably set to room temperature to 100° C.

(Metal Removal Solution Treatment)

According to the present embodiment, when Cu is used as the metal at the second step, fine Cu particles can be removed with nitric acid ($HNO_3$) solution. At this time, concentration of nitric acid is preferably in a range of 0.001 to 70 mass %, more preferably in a range of 0.01 to 0.1 mass %. A treatment time may be set in accordance with a process tact time, preferably 0.5 minutes to 10 minutes, more preferably 1 minute or more and less than 3 minutes. Temperature of the nitric acid solution may be appropriately selected considering the treatment time and the evaporation loss and, preferably set to room temperature to 100° C. Treatment solution used at this step is not limited to nitric acid but, based on target metal to be removed, solution capable of dissolving the target metal may be selected. For example, for Ag, Pt, and Au, aqua regia ($HCl/HNO_3$) or potassium iodide solution (KI) may be used. Suitable concentration and treatment time are the same as those for the case using Cu.

(Third Step: Alkali Solution Treatment)

According to the present embodiment, when an alkali solution treatment is selected as the third step, a type of alkali to be used is not particularly limited. For example, solution containing one or more types of alkali such as, as inorganic alkali, lithium hydroxide, sodium hydroxide, potassium hydroxide, ammonium hydroxide, hydrazine and, as organic alkali, tetramethylammonium hydroxide and choline may be used. PH of the alkali solution is preferably in a range of 9.0 to 14.0, more preferably in a range of 10.0 to 12.0. When pH falls below the lower limit, the reaction is difficult to proceed and, when pH exceeds the upper limit, a reaction rate is reduced and, further, reagent cost is increased. Therefore, such pH is not preferable. A time of contacting the alkali solution is preferably 600 seconds or less, more preferably 120 seconds or less. For example, when solution having concentration of Cu at 170 ppm and concentration of HF at 25 mass % is used for carrying out the porous treatment for 3 minutes, carrying out a treatment using 1% KOH solution for 30 seconds can set a thickness of a porous layer to 150 to 200 nm. However, other than those conditions of pH and the contact time described above, conditions of pH and the contact time may be set as desired, as long as a porous layer of 50 to 400 nm in thickness can be formed in the one surface. That is, any conditions may be set for the porous structure making process and for the alkali treatment at the third step so that the thickness of the porous layer falls within the range. When the porous layer is 50 to 400 nm in thickness, both of an effect of improving the conversion efficiency and an effect of reducing the surface reflectance can be achieved.

In order to adjust the reaction rate, the oxidizing agent (hydrogen peroxide, ozone and the like) and a surfactant (an anionic surfactant, a neutral surfactant and the like) may be added to the alkali solution. For example, addition of an amino alcohol-based surfactant to 1% KOH can reduce an etching rate to 1/10 or less.

(Third Step: Acid Solution Treatment)

In another embodiment, when the acid solution treatment is selected as the third step, acid solution containing hydrofluoric acid and nitric acid may be used. In the acid solution, preferably, concentration of hydrofluoric acid is 0.1 to 5.0 mass %, concentration of nitric acid is 20 to 50 mass %, and the rest amount is the water. This is preferable because the reaction rate is sufficient when the concentration of hydrofluoric acid is 0.1 mass % or more and, when the concentration is 5.0 mass % or less, the reaction rate may be controlled to facilitate adjustment of an etching amount. The concentration of nitric acid is preferably 20 mass % or more, thereby the reaction rate may be controlled to facilitate the adjustment of the etching amount, and more preferably 50 mass % or less in terms of reduction in cost of the chemical solution. Temperature of the acid solution is preferably 10 to 40° C., more preferably 15 to 30° C. This is because the reaction rate is sufficient when the temperature is 10° C. or above, while the reaction rate may be controlled to facilitate the adjustment of the etching amount when the temperature is 40° C. or below. A time of contacting the acid solution is preferably 10 minutes or less, more preferably 3 minutes or less. For example, when the porous treatment is carried out for three minutes by using solution containing Cu at concentration of 170 ppm and hydrofluoric acid at concentration of 25 mass %, by treating for 1 minute using acid solution containing hydrofluoric acid of 1 mass % and nitric acid of 35 mass %, a thickness of the porous layer may be set to 202 nm. Note that conditions of mixing and the contact time of hydrofluoric acid and nitric acid may be set as desired, as long as the porous layer of 50 to 400 nm in thickness can be formed in the one surface. That is, any conditions may be set for the porous structure making process and for the acid solution treatment at the third step so that the thickness of the porous layer falls within the range. When the porous layer is 50 to 400 nm in thickness, both of the effect of improving the conversion efficiency and the effect of reducing the surface reflectance can be achieved. By a porous structure making process under normal conditions as described above, the porous layer of more than 400 nm in thickness is formed and it is difficult to control the thickness to be 50 to 400 nm. Therefore, the third step is required.

In the acid solution containing hydrofluoric acid and nitric acid, components such as acetic acid, phosphoric acid, sulfuric acid, and the surfactant (the anionic surfactant, the neutral surfactant and the like) that do not significantly hinder an etching action of the porous layer may be added.

(Third Step: Oxidation Treatment)

In another embodiment, when an oxidation treatment is selected as the third step, the oxidation treatment is not particularly limited as long as it can reduce the recombination centers in the wafer surface, but may be carried out as follows, for example. A preferable thickness of an oxide film formed on the wafer surface by the oxidation treatment is 1 to 100 nm. When the thickness is less than 1 nm, an effect of reducing the recombination centers can not be sufficiently obtained and, when the thickness exceeds 100 nm, at a time of forming electrodes in a solar cell production process, contact resistance increases, possibly leading to reduction in the conversion efficiency as the solar cell, as a result.

First, the at least one surface of the semiconductor wafer can be oxidized by the treatment to contact solution containing the oxidant to the surface. As the solution containing the oxidant, there is, for example, ozone water in which ozone gas is dissolved in the water. In this case, concentration of ozone is preferably 0.1 to 20 ppm. This is because, when the concentration of ozone is less than 0.1 ppm, the wafer surface can not be sufficiently oxidized and, when a treatment is carried out with ozone water containing more than 20 ppm of ozone, an effect commensurate with the concentration can not be obtained and an oxidation capability becomes saturated. Further, a treatment time is preferably 1 to 10 minutes, more preferably 5 to 10 minutes. This is because, when the treatment time is less than 1 minute, the wafer surface can not be sufficiently oxidized and, when the treatment time exceeds 10 minutes, an effect commensurate with the treatment time can not be obtained and the oxidation capability becomes saturated. Treatment temperature may be set to room temperature.

Hydrogen peroxide water may also be used. In this case, concentration of hydrogen peroxide is preferably 0.1 to 30 mass %, more preferably 0.3 to 30 mass %. This is because, when the concentration of hydrogen peroxide is less than 0.1 mass %, the wafer surface can not be sufficiently oxidized and, when a treatment is carried out with hydrogen peroxide water containing hydrogen peroxide of more than 30 mass %, an effect commensurate with the concentration can not be obtained and the oxidation capability becomes saturated. Further, a treatment time is preferably 1 to 30 minutes, more preferably 5 to 30 minutes. This is because, when the treatment time is less than 1 minute, the wafer surface can not be sufficiently oxidized and, when the treatment time exceeds 30 minutes, an effect commensurate with the treatment time can not be obtained and the oxidation capability becomes saturated. Treatment temperature may be set to 20 to 80° C.

Also, a mixed solution of ammonia/hydrogen peroxide (so-called SC-1 cleaning solution) or a mixed solution of hydrochloric acid/hydrogen peroxide (so-called SC-2 cleaning solution) may be used. In the SC-1 cleaning solution, concentration of ammonia is preferably 0.1 to 5 mass %, more preferably 1 to 3 mass %. In the SC-2 cleaning solution, concentration of hydrochloric acid is preferably 0.1 to 5 mass %, more preferably 1 to 3 mass %. Also, concentration of hydrogen peroxide is preferably 0.1 to 30 mass %, more preferably 0.3 to 10 mass %. This is because either of the values below the lower limit may cause the wafer surface insufficiently oxidized, and either of the values exceeding the upper limit renders difficult to carry out sufficient washing in a rinsing step later. Note that, in the SC-1 cleaning solution, ammonia may be replaced with inorganic alkali such as NaOH and KOH or organic alkali such as TMAH (tetramethylammonium hydroxide) and choline. Further, a treatment time is preferably 1 to 20 minutes, more preferably 5 to 20 minutes. This is because, when the treatment time is less than 1 minute, the wafer surface can not be sufficiently oxidized and, when the treatment time exceeds 20 minutes, an effect commensurate with the concentration can not be obtained and the oxidation capability becomes saturated. Treatment temperature may be set to 20 to 80° C.

Second, at least one surface of the semiconductor wafer can be subjected to a heat treatment in an atmosphere containing oxygen. The heat treatment is not particularly limited as long as a technique thereof is generally used for thermal oxidation of the semiconductor wafer, but may be, for example, dry oxidation or pyrogenic oxidation. Temperature of the heat treatment is preferably 600 to 1200° C., more preferably 800 to 1000° C. A treatment time of the heat treatment is preferably 1 to 30 minutes, more preferably 5 to 20 minutes. This is because, either the temperature or the treatment time of the heat treatment below the lower limit may render unable to obtain a desired effect due to lack of oxidation capacity, and either of the values exceeding the upper limit makes the oxidation capability saturated.

Third, on at least one surface of the semiconductor wafer, an oxide film can be formed by a liquid phase growth method. Here, the "liquid phase growth method" is a method, by immersing the wafer in solution in which $H_3BO_3$ is added to $H_2SiF_6$ solution in which Si is saturated, for forming an $SiO_2$ film on the wafer surface. By this method also, the dangling bonds can be subjected to the oxidation treatment, and thereby the recombination centers are extinguished. The treatment solution is prepared in the following manner, for example. First, silica gel particles are added in $H_2SiF_6$ solution at concentration of 4 mol/L and the mixture is stirred at room temperature for 24 hours, followed by removal of undissolved silica gel. Then, $H_3BO_3$ is added in this solution so that concentration thereof becomes 0.01 to 1 mol/L, preferably 0.05 to 0.15 mol/L. A treatment time is more than 1 minute, preferably 10 to 30 minutes, and treatment temperature is 20° C. or higher, preferably 30 to 40° C.

At each step illustrated in FIG. 1, a method of contacting the treatment solution to the wafer surface may be, for example, an immersion method or a spraying method. A casting method of dropping the treatment solution onto one side of the wafer acting as the light receiving surface may also be used.

Further, after at least one of the steps S1 to S5, a washing step with the water may be carried out.

As described above, the method of producing the wafer for the solar cell according to the present invention is applicable to the polycrystalline silicon wafer as well as the single crystal silicon wafer. As mentioned previously, a method of forming a textured structure is suitable for single crystal silicon and therefore, for polycrystalline silicon that has various plane orientations appeared on the surface, forming a uniform textured structure on the entire wafer surface has been difficult. However, since the porous treatment according to the present invention can form unevenness finer than that of conventional textured structure, the reflectance of the surface of the polycrystalline silicon wafer can be sufficiently suppressed. Also, adopting the alkali solution treatment or the acid solution treatment at the third step of the present invention enables the method to be safer at lower cost comparing to conventional method and, since the necessity for using the oxidizing agent such as hydrogen peroxide as a processing agent is eliminated, complexity of wastewater treatment can be avoided.

Further, although production of the wafer for the solar cell to be used for crystalline silicon solar cell from a single crystal silicon wafer or a polycrystalline silicon wafer has been described above, the present invention is not limited to crystalline silicon but is also applicable to a wafer for a solar cell used for amorphous silicon solar cell and a thin film solar cell, as a matter of course.

(Method of Producing Solar cell)

A method of producing the solar cell according to the present invention, in addition to the steps of the method of producing the wafer for the solar cell according to the present invention described so far, further includes a process of producing the solar cell using the wafer for the solar cell. The process of producing the cell includes, at least, a step of forming a pn junction by a dopant diffusion heat treatment and a step of forming electrodes. In the dopant diffusion heat treatment, phosphorus is thermally diffused for a p-type substrate.

Note that the step of forming the pn junction may be carried out before the porous structure making process according to the present invention. That is, after the etching treatment for removal of damage caused by slicing, in a state that the wafer has the pn junction formed by the dopant diffusion heat treatment, the porous structure making process according to the present invention is carried out. The solar cell can be produced by forming the electrodes on the wafer for the solar cell thus obtained.

The method of producing the solar cell according to the present invention can obtain a solar cell having less reflection loss of the incident light on the light receiving surface of the cell and high conversion efficiency.

(Method of Producing Solar Cell Module)

A method of producing a solar cell module according to the present invention, in addition to the steps of the method of producing the solar cell described above, further includes a process of producing a solar cell module using the solar cell. The process of producing the module includes a step of arranging a plurality of solar cells and wiring electrodes, a step of arranging the wired solar cells on a tempered glass substrate and sealing with resin and a protective film, and a step of assembling an aluminum frame and electrically connecting a terminal cable to the wiring.

The method of producing the solar cell module according to the present invention can suppress the reflection loss of the incident light on the light receiving surface of the solar cell, and thus to obtain a solar cell module having high conversion efficiency.

Although the present invention has been described above, the embodiments are illustrated as typical examples, and therefore the present invention is not limited thereto but may be changed in various manners within a scope of the abstract of the present invention.

EXAMPLES

In order to further clarify effects of the present invention, comparative evaluations for Examples and Comparative Examples described below will be discussed.

Experimental Example 1

Carrying Out the Alkali Solution treatment as the Third Step

<Preparation of Sample>

Example 1

First, a p-type (100) single crystal silicon wafer in 20 mm square (thickness: 4.25 mm) was prepared and, by using acid solution prepared by mixing hydrofluoric acid of 50 mass %/nitric acid of 70 mass %/the water=1:4:5 (a volume ratio), an etching treatment was carried out at room temperature for 3 minutes, followed by drying the wafer. All subsequent steps were carried out at the room temperature. The wafer was immersed in ethanol solution of 99 mass % for 1 minute. Then, the wafer was immersed in mixed solution of 5 mL of copper nitrate solution containing 1000 ppm of Cu, 15 mL of hydrofluoric acid of 50 mass % and 10 mL of the water, for 3 minutes. This process was carried out under a normal indoor environment, i.e., a light irradiation environment. Subsequently, the wafer was immersed in nitric acid of 0.1 mass % for 5 minutes and dried in a nitrogen atmosphere. Then, the wafer was immersed in KOH of 1 mass % for 10 seconds as the alkali solution treatment, and dried in the nitrogen atmosphere, thus the wafer for the solar cell was produced.

Example 2

In Example 2, the wafer for the solar cell was prepared in the same manner as Example 1, except that immersion was carried out in KOH of 1 mass % for 30 seconds as the alkali solution treatment.

Example 3

In Example 3, the wafer for the solar cell was prepared in the same manner as Example 1, except that immersion was carried out in KOH of 1 mass % for 60 seconds as the alkali solution treatment.

Example 4

In Example 4, the wafer for the solar cell was prepared in the same manner as Example 1, except that immersion was carried out in tetramethylammonium hydroxide (TMAH) of 1 mass % for 30 seconds as the alkali solution treatment.

Example 5

In Example 5, the wafer for the solar cell was prepared in the same manner as Example 1, except that immersion was carried out in hydrazine of 1 mass % for 30 seconds as the alkali solution treatment.

Example 6

In Example 6, the wafer for the solar cell was prepared in the same manner as Example 1, except that immersion was carried out in KOH of 1 mass % for 100 seconds as the alkali solution treatment.

Example 7

In Example 7, the wafer for the solar cell was prepared in the same manner as Example 1, except that immersion was carried out in KOH of 1 mass % for 5 seconds as the alkali solution treatment.

Comparative Example 1

The producing process of Example 1 was carried out up to the step of immersing the wafer in nitric acid of 0.1 mass % for 5 minutes and drying in the nitrogen atmosphere, thus Comparative Example 1 was carried out. That is, Comparative Example 1 skips the alkali solution treatment (0 min of the treatment time) according to the present invention alone.

Comparative Example 2

The producing process of Example 1 was carried out up to the step of the etching treatment by the acid solution prepared by hydrofluoric acid of 50 mass %/nitric acid of 70 mass %/the water=1:4:5 (the volume ratio), at the room temperature for 3 minutes. Then, the wafer was dried, thus Comparative Example 2 was carried out. That is, Comparative Example 2 skips the porous structure making process and the alkali solution treatment according to the present invention.

Comparative Example 3

The producing process of Example 1 was carried out up to the step of the etching treatment by the acid solution prepared by hydrofluoric acid of 50 mass %/nitric acid of 70 mass %/the water=1:4:5 (the volume ratio), at the room temperature for 3 minutes. Then, the wafer was dried and immersed in KOH of 1 mass % for 30 seconds as the alkali solution treatment and then dried in the nitrogen atmosphere, thus Comparative Example 3 was carried out. That is, Comparative Example 3 skips the porous structure making process according to the present invention alone.

<Evaluation 1: Measurement of Reflectance>

By using a reflectance measuring instrument (manufactured by Shimazu Corporation: SolidSpec3700), a reflectance spectrum on the treated surface of the wafer was measured in a range of 300 to 1200 nm Since the sunlight contains a high proportion of light at a wavelength of 500 to 700 nm, low reflectance is desirable for this range of the wavelength. Therefore, Table 1 shows relative reflectances at wavelengths of 600 nm and 700 nm. From a comparison between Examples 1-7 and Comparative Examples 2 and 3, it was found that the porous structure making process according to the present invention reduces the reflectance on the treated surface of the wafer. It was also found that, from Examples 1-7, the alkali treatment according to the present invention increases the reflectance to some extent.

TABLE 1

| | Porous Structure Making Process | Alkali Treatment Time (sec) | 600 nm Reflectance (%) | 700 nm Reflectance (%) | Note |
|---|---|---|---|---|---|
| Example 1 | Yes | 10 | 3.58 | 3.31 | KOH |
| Example 2 | Yes | 30 | 7.00 | 6.94 | KOH |
| Example 3 | Yes | 60 | 10.16 | 9.90 | KOH |
| Example 4 | Yes | 30 | 9.01 | 8.89 | TMAH |
| Example 5 | Yes | 30 | 9.52 | 9.01 | Hydrazine |
| Example 6 | Yes | 100 | 12.54 | 11.49 | KOH |
| Example 7 | Yes | 5 | 3.42 | 3.39 | KOH |
| Comparative Example 1 | Yes | — | 2.95 | 2.65 | — |
| Comparative Example 2 | No | — | 25.21 | 23.94 | — |
| Comparative Example 3 | No | 30 | 28.54 | 26.85 | — |

<Evaluation 2: Measurement of Conversion Efficiency>

P-OCD (manufactured by Tokyo Ohka Kogyo Co., Ltd., Part No. P-110211) was applied, by spin coating, to the wafer of Examples and Comparative Examples. Then, the wafer was subjected to a diffusion heat treatment to form the pn junction, and phosphorus glass on the surface was removed by hydrogen fluoride. Then, an ITO film was formed as an anti-reflection film on a phosphorus diffusion surface of the wafer surface by a sputtering method. Further, the electrodes were formed on front and rear surfaces of the wafer by applying Ag paste for an Ag electrode to the front surface and Al paste for an Al electrode to the rear surface and then carrying out a thermal treatment, thus the solar cell was produced. Table 2 shows results of measurement of energy conversion efficiency measured by an energy conversion efficiency measuring instrument (produced by Izumi Tech Co.: YQ-250BX). Each of Examples had conversion efficiency higher than that of Comparative Examples. In particular, comparing between Examples 1-7 and Comparative Example 1, even though the reflectance in Comparative Example 1 was lower than that of Examples 1-7, the conversion efficiency in Comparative Example 1 was lower than that of Examples 1-7. Therefore, it was found that, by carrying out the porous structure making process and the alkali solution treatment according to the present invention, actions other than an action to reduce the reflection loss on the surface can bring higher conversion efficiency. It was also found that, in Examples 1-5 in which the thickness of the porous layer was 50 to 400 nm, conversion efficiency was even higher than that of Examples 6 and 7. Note that, since in Examples a fairly thick test piece of 425 μm in thickness was used, the values of conversion efficiency are lower than those obtained under typical example conditions. However, the conversion efficiency when applied to wafers for solar cell products in the concerned field is expected to increase by a few percent from the results shown in Table 2.

TABLE 2

| | Porous Structure Making Process | Alkali Treatment Time (sec) | pH | Thickness of Porous Layer (nm) | Energy Conversion Efficiency (%) |
|---|---|---|---|---|---|
| Example 1 | Yes | 10 | 11.5 | 395 | 12.4 |
| Example 2 | Yes | 30 | 11.5 | 195 | 13.5 |
| Example 3 | Yes | 60 | 11.5 | 58 | 11.3 |
| Example 4 | Yes | 30 | 11.9 | 175 | 12.4 |
| Example 5 | Yes | 30 | 11.8 | 155 | 11.3 |
| Example 6 | Yes | 100 | 11.5 | 48 | 10.5 |
| Example 7 | Yes | 5 | 11.5 | 445 | 10.9 |
| Comparative Example 1 | Yes | — | — | 465 | 8.4 |
| Comparative Example 2 | No | — | — | — | 7.6 |
| Comparative Example 3 | No | 30 | 11.5 | — | 8.2 |

Experimental Example 2

Carrying Out the Acid Solution Treatment as the Third Step

<Preparation of Sample>

Examples 1-15

First, a p-type (100) single crystal silicon wafer in 20 mm square (thickness: 4.25 mm) was prepared and, by using the acid solution prepared by mixing hydrofluoric acid of 50 mass %/nitric acid of 70 mass %/the water=1:4:5 (the volume ratio), an etching treatment was carried out at room temperature for 3 minutes, followed by drying the wafer. All subsequent steps were carried out at the room temperature. The wafer was immersed in ethanol solution of 99 mass % for 1 minute. Then, the wafer was immersed in mixed solution of 5 mL of copper nitrate solution containing 1000 ppm of Cu, 15 mL of hydrofluoric acid of 50 mass %, and 10 mL of the water, for 3 minutes. This process was carried out under a normal indoor environment, i.e., a light irradiation environment. Subsequently, the wafer was immersed in nitric acid of 0.1 mass % for 5 minutes and dried in the nitrogen atmosphere. Then, as the acid solution treatment, the wafer was immersed in acid solution composed of hydrofluoric acid and nitric acid at concentrations shown in Table 3 and the water for the rest amount, for a treatment time shown in Table 3, and dried in the nitrogen atmosphere, thus the wafer for the solar cell was produced.

Comparative Example 1

The producing process of Example 1 was carried out up to the step of immersing the wafer in nitric acid of 0.1 mass % for 5 minutes and drying in the nitrogen atmosphere, thus Comparative Example 1 was carried out. That is, Comparative Example 1 skips the acid solution treatment according to the present invention (0 min of treatment time) alone.

Comparative Example 2

The producing process of Example 1 was carried out up to the step of the etching treatment by the acid solution prepared by hydrofluoric acid of 50 mass %/nitric acid of 70 mass %/the water=1:4:5 (the volume ratio), at the room temperature for 3 minutes. Then, the wafer was dried, thus Comparative Example 2 was carried out. That is, Comparative Example 2 skips the porous structure making process and the acid solution treatment according to the present invention, Comparative Example 3

The producing process of Example 1 was carried out up to the step of the etching treatment by the acid solution prepared by hydrofluoric acid of 50 mass %/nitric acid of 70 mass %/the water=1:4:5 (the volume ratio), at the room temperature for 3 minutes. Then, the wafer was dried and, as the acid solution treatment, immersed in the acid solution composed of hydrofluoric acid of 1 mass %, nitric acid of 35 mass % and the water for the rest amount for 1 minute. The wafer was then dried in the nitrogen atmosphere, thus Comparative Example 3 was carried out. That is, Comparative Example 3 skips the porous structure making process according to the present invention alone.

<Evaluation 1: Measurement of Reflectance>

Measurement of the spectral reflectance was carried out in the same manner as Experimental Example 1. Table 3 shows the relative reflectances at wavelengths of 600 nm and 700 nm. From a comparison between Examples 1-15 and Comparative Examples 2 and 3, it was found that the porous structure making process according to the present invention reduces the reflectance on the treated surface of the wafer. It was also found that, from a comparison between Examples 1-15 and Comparative Example 1, the acid solution treatment according to the present invention increases the reflectance to some extent.

TABLE 3

| | Porous Structure Making Process | Hydrofluoric Acid (mass %) | Nitric Acid (mass %) | Acid Solution Treatment Time (min) | 600 nm Reflectance (%) | 700 nm Reflectance (%) |
|---|---|---|---|---|---|---|
| Example 1 | Yes | 1 | 35 | 1 | 9.82 | 8.76 |
| Example 2 | Yes | 1 | 35 | 2 | 10.42 | 9.95 |
| Example 3 | Yes | 1 | 35 | 5 | 17.25 | 15.85 |
| Example 4 | Yes | 0.05 | 35 | 1 | 3.22 | 3.01 |
| Example 5 | Yes | 0.1 | 35 | 1 | 5.22 | 4.76 |
| Example 6 | Yes | 0.5 | 35 | 1 | 8.24 | 7.44 |
| Example 7 | Yes | 2 | 35 | 1 | 10.22 | 9.85 |

TABLE 3-continued

| | Porous Structure Making Process | Hydrofluoric Acid (mass %) | Nitric Acid (mass %) | Acid Solution Treatment Time (min) | 600 nm Reflectance (%) | 700 nm Reflectance (%) |
|---|---|---|---|---|---|---|
| Example 8 | Yes | 5 | 35 | 1 | 11.23 | 10.95 |
| Example 9 | Yes | 7 | 35 | 1 | 13.50 | 12.54 |
| Example 10 | Yes | 1 | 15 | 1 | 13.30 | 12.32 |
| Example 11 | Yes | 1 | 20 | 1 | 10.51 | 10.01 |
| Example 12 | Yes | 1 | 30 | 1 | 10.02 | 9.85 |
| Example 13 | Yes | 1 | 40 | 1 | 9.85 | 8.95 |
| Example 14 | Yes | 1 | 50 | 1 | 9.75 | 8.77 |
| Example 15 | Yes | 1 | 55 | 1 | 9.55 | 8.53 |
| Comparative Example 1 | Yes | — | — | — | 2.95 | 2.65 |
| Comparative Example 2 | No | — | — | — | 25.21 | 23.94 |
| Comparative Example 3 | No | 1 | 35 | 1 | 26.25 | 24.75 |

<Evaluation 2: Measurement of Conversion Efficiency>

Table 4 shows results of measurement of the energy conversion efficiency carried out in the same manner as Experimental Example 1. The conversion efficiency was higher in each Example than Comparative Examples. In particular, comparing between Examples 1-15 and Comparative Example 1, even though the reflectance in Comparative Example 1 was lower than that of Examples 1-15, the conversion efficiency in Comparative Example 1 was lower than that of Examples 1-15. Therefore, it was found that, by carrying out the porous structure making process and the acid solution treatment according to the present invention, actions other than the action to reduce the reflection loss on the surface can bring higher conversion efficiency. It was also found that, in Examples 1, 2, 5-15 in which the thickness of the porous layer was 50 to 400 nm, the conversion efficiency was even higher than that of Examples 3 and 4. Note that, since in Examples a fairly thick test piece of 425 μm in thickness was used, the values of conversion efficiency are lower than those obtained under typical example conditions. However, the conversion efficiency when applied to wafers for solar cell products in the concerned field is expected to increase by a few percent from the results shown in Table 4.

TABLE 4

| | Porous Structure Making Process | Hydrofluoric Acid (mass %) | Nitric Acid (mass %) | Acid Solution Treatment Time (min) | Thickness of Porous Layer (nm) | Energy Conversion Efficiency (%) |
|---|---|---|---|---|---|---|
| Example 1 | Yes | 1 | 35 | 1 | 202 | 14.5 |
| Example 2 | Yes | 1 | 35 | 2 | 102 | 14.2 |
| Example 3 | Yes | 1 | 35 | 5 | 12 | 8.5 |
| Example 4 | Yes | 0.05 | 35 | 1 | 448 | 8.7 |
| Example 5 | Yes | 0.1 | 35 | 1 | 398 | 12.9 |
| Example 6 | Yes | 0.5 | 35 | 1 | 294 | 13.5 |
| Example 7 | Yes | 2 | 35 | 1 | 152 | 13.7 |
| Example 8 | Yes | 5 | 35 | 1 | 95 | 11.5 |
| Example 9 | Yes | 7 | 35 | 1 | 52 | 9.0 |
| Example 10 | Yes | 1 | 15 | 1 | 65 | 9.5 |
| Example 11 | Yes | 1 | 20 | 1 | 102 | 12.1 |
| Example 12 | Yes | 1 | 30 | 1 | 155 | 14.1 |
| Example 13 | Yes | 1 | 40 | 1 | 223 | 14.5 |
| Example 14 | Yes | 1 | 50 | 1 | 231 | 14.2 |
| Example 15 | Yes | 1 | 55 | 1 | 235 | 14.0 |
| Comparative Example 1 | Yes | — | — | — | 465 | 8.4 |
| Comparative Example 2 | No | — | — | — | — | 7.6 |
| Comparative Example 3 | No | 1 | 35 | 1 | — | 7.4 |

Experimental Example 3

Carrying Out the Oxidation Treatment as the Third Step

Experimental Example 3-1

<Preparation of Sample>

First, a p-type (100) single crystal silicon wafer in 20mm square was prepared and, by using the acid solution prepared by mixing hydrofluoric acid of 50 mass %/nitric acid of 70 mass %/the water=1:4:5 (the volume ratio), an etching treatment was carried out at room temperature for 3 minutes, followed by drying the wafer. All subsequent steps were carried out at the room temperature. The wafer was immersed in the ethanol solution of 99 mass % for 1 minutes. Then, the wafer was immersed in mixed solution of 5 mL of copper nitrate solution containing 1000 ppm of Cu, 15 mL of hydrofluoric acid of 50 mass % and 10 mL of the water, for 3 minutes. This process was carried out under a normal indoor environment, i.e., a light irradiation environment. The above process corresponds to the porous structure making process. Subsequently, the wafer was immersed in nitric acid of 0.1 mass % for 5 minutes and dried in the nitrogen atmosphere. Then, for each Example, the wafer was subjected to the oxidation treatment described below, and the wafer surface was dried by an air blower, thus the wafer for the solar cell according to the present invention was produced.

Examples 1-4

The oxidation treatment was carried out by immersing the wafer in ozone water. A treatment time was 10 minutes, and concentration of ozone is shown in Table 5.

Examples 5-7

The oxidation treatment was carried out by immersing the wafer in hydrogen peroxide water. A treatment time was 10 minutes, and concentration of hydrogen peroxide is shown in Table 5.

Examples 8-16

The oxidation treatment was carried out by immersing the wafer in mixed solution of alkali component/hydrogen peroxide. A treatment time was 10 minutes, and a type of used alkali and concentration of alkali and hydrogen peroxide are shown in Table 5.

Examples 17-22

The oxidation treatment was carried out by immersing the wafer in mixed solution of hydrochloric acid/hydrogen peroxide. A treatment time was 10 minutes, and concentration of hydrochloric acid and hydrogen peroxide is shown in Table 5.

Examples 23-27

The oxidation treatment was carried out by the liquid phase growth method (LPD: Liquid Phase Deposition). Specifically, first, $H_2SiF_6$ solution at concentration of 4 mol/L was prepared, and then silica gel particles (manufactured by Kanto Chemical Co., Inc., special grade reagent: white) were added to the solution and the mixture was stirred at room temperature for 24 hours. Then, $H_3BO_3$ was added to this solution so that concentration thereof becomes 1 mol/L, thus a treatment solution was obtained. The wafer was immersed in this treatment solution. Treatment temperature and a treatment time are shown in Table 5.

Examples 28-33

The wafer was subjected to a heat treatment of the dry oxidation or the pyrogenic oxidation. Temperature for the heat treatment was 800° C. The treatment time is shown in Table 5.

Comparative Example 1

The producing process of Example 1 was carried out up to the step of the etching treatment by the acid solution prepared by hydrofluoric acid of 50 mass %/nitric acid of 70 mass %/the water =1:4:5 (the volume ratio), at the room temperature for 3 minutes. Then, the wafer was dried, thus the wafer for the solar cell according to Comparative Example 1 was produced. That is, Comparative Example 1 skips the porous structure making process and the oxidation treatment according to the present invention.

Comparative Example 2

In the same manner as Examples except that no oxidation treatment was carried out, the wafer for the solar cell according to Comparative Example 2 was produced.

<Estimation 1: Measurement of Lifetime>

A lifetime was measured for each wafer in Examples and Comparative Examples in the following manner. The lifetime is an index that represents a life of electrons and holes in the substrate of the solar cell generated by received light. The higher a value of the lifetime is, the higher the conversion efficiency of the solar cell is. In the present experimental example, therefore, instead of producing solar cells and measuring the conversion efficiency thereof, the lifetime was measured to evaluate a magnitude of the conversion efficiency. For the measurement, WT-2100 manufactured by Semirabo was used. In measurement, a surface passivation treatment such as an iodine pack treatment and the like was not carried out but a produced sample was directly measured to determine an effect of a surface state.

<Evaluation 2: Measurement of Reflectance>

The reflection spectrum was measured in the same manner as Experimental Example 1. The relative reflectances at wavelength 600 nm are shown in Table 5.

TABLE 5

| | Porous Structure Making Process | Oxidation Treatment | | Lifetime ($\mu$sec) | 600 nm Relative Reflectance (%) |
| --- | --- | --- | --- | --- | --- |
| | | Treatment Method | Treatment Condition | | |
| Comparative Example 1 | No | No | — | 1.95 | 29.4 |
| Comparative Example 2 | Yes | No | — | 2.01 | 4.31 |
| Example 1 | Yes | Ozone Water | 0.3 ppm | 2.34 | 4.54 |
| Example 2 | Yes | Ozone Water | 0.5 ppm | 2.43 | 4.46 |
| Example 3 | Yes | Ozone Water | 1.0 ppm | 2.49 | 4.39 |
| Example 4 | Yes | Ozone Water | 5.0 ppm | 2.47 | 4.42 |
| Example 5 | Yes | Hydrogen Peroxide Water | 0.3% | 2.05 | 4.62 |
| Example 6 | Yes | Hydrogen Peroxide Water | 0.5% | 2.28 | 4.45 |
| Example 7 | Yes | Hydrogen Peroxide Water | 1.0% | 2.34 | 4.23 |
| Example 8 | Yes | $NH_4OH/H_2O_2$ Solution | 0.3%/2% | 2.04 | 4.44 |
| Example 9 | Yes | $NH_4OH/H_2O_2$ Solution | 0.5%/2% | 2.24 | 4.65 |

TABLE 5-continued

| | Porous Structure | Oxidation Treatment | | Lifetime | 600 nm Relative |
|---|---|---|---|---|---|
| | Making Process | Treatment Method | Treatment Condition | (μsec) | Reflectance (%) |
| Example 10 | Yes | $NH_4OH/H_2O_2$ Solution | 2%/2% | 2.31 | 4.54 |
| Example 11 | Yes | $NH_4OH/H_2O_2$ Solution | 5%/2% | 2.29 | 4.46 |
| Example 12 | Yes | $NH_4OH/H_2O_2$ Solution | 6%/2% | 2.04 | 4.63 |
| Example 13 | Yes | $NH_4OH/H_2O_2$ Solution | 2%/2% | 2.25 | 4.17 |
| Example 14 | Yes | $NH_4OH/H_2O_2$ Solution | 2%/5% | 2.31 | 4.96 |
| Example 15 | Yes | $KOH/H_2O_2$ Solution | 2%/2% | 2.29 | 4.56 |
| Example 16 | Yes | $TMAH/H_2O_2$ Solution | 2%/2% | 2.31 | 4.62 |
| Example 17 | Yes | $HCl/H_2O_2$ Solution | 0.3%/2% | 2.05 | 4.95 |
| Example 18 | Yes | $HCl/H_2O_2$ Solution | 0.5%/2% | 2.31 | 4.62 |
| Example 19 | Yes | $HCl/H_2O_2$ Solution | 2%/2% | 2.34 | 4.25 |
| Example 20 | Yes | $HCl/H_2O_2$ Solution | 2%/0.3% | 2.04 | 4.69 |
| Example 21 | Yes | $HCl/H_2O_2$ Solution | 2%/0.5% | 2.37 | 4.76 |
| Example 22 | Yes | $HCl/H_2O_2$ Solution | 2%/2% | 2.41 | 4.68 |
| Example 23 | Yes | LPD Method | 35° C./0.5 min | 2.03 | 4.29 |
| Example 24 | Yes | LPD Method | 35° C./1 min | 2.21 | 4.82 |
| Example 25 | Yes | LPD Method | 35° C./10 min | 2.25 | 4.32 |
| Example 26 | Yes | LPD Method | 20° C./10 min | 2.19 | 4.23 |
| Example 27 | Yes | LPD Method | 50° C./10 min | 2.30 | 4.66 |
| Example 28 | Yes | Pyrogenic Oxidation | 5 min | 2.35 | 4.85 |
| Example 29 | Yes | Pyrogenic Oxidation | 10 min | 2.54 | 4.69 |
| Example 30 | Yes | Pyrogenic Oxidation | 20 min | 2.55 | 4.56 |
| Example 31 | Yes | Dry Oxidation | 5 min | 2.37 | 4.29 |
| Example 32 | Yes | Dry Oxidation | 10 min | 2.51 | 4.92 |
| Example 33 | Yes | Dry Oxidation | 20 min | 2.55 | 4.22 |

*In Table 5, "%" means "mass %"

<Evaluation Results>

It can be seen from Table 5 that, comparing Comparative Example 1 and Comparative Example 2, although the reflectance of Comparative Example 2 was significantly reduced than that of Comparative Example 1, the lifetime as an index for evaluating the conversion efficiency did not increase very much in Comparative Example 2. Therefore, it was found that, although the reflectance was sufficiently reduced by carrying out the porous structure making process defined by the present invention to the wafer surface, carrying out such process alone was not able to be related well to increase the conversion efficiency. Next, in each Example, while maintaining a low reflectance of the same level as Comparative Example 2, the lifetime was increased, comparing to that of Comparative Example 1 and Comparative Example 2. Therefore, it was found that, by carrying out the oxidation treatment defined by the present invention, a wafer for the solar cell that can produce the solar cell having higher conversion efficiency can be obtained. Moreover, since the oxidation treatment does not greatly increase the reflectance, the oxidation treatment is considered as a treatment that does not change unevenness of the surface very much.

Experimental Example 3-2

Next, a result that, the effect of the present invention that the oxidation treatment improves the lifetime regardless of different conditions of the porous structure making process, is shown by the following examples.

(Porous Structure Making Process Condition 2)

Except that the step of treating with hydrofluoric acid containing Cu is modified as described below, the wafer for the solar cell was produced in the same manner as Experimental Example 3-1. That is, the wafer was immersed in mixed solution of 5 mL of copper nitrate solution containing 1000 ppm of Cu, 15 mL of hydrofluoric acid of 50 mass % and 10 mL of the water, for 5 minutes. The wafer was subjected to the oxidation treatment to be immersed in ozone water containing ozone at concentration of 5.0 ppm for 15 minutes in Example 34, while the wafer was not subjected to the oxidation treatment in Comparative Example 3.

(Porous Structure Making Process Condition 3)

Except that the step of treating with hydrofluoric acid containing Cu is modified as described below, the wafer for the solar cell was produced in the same manner as Experimental Example 3-1. That is, the wafer was immersed in mixed solution of 5 mL of copper nitrate solution containing 1000 ppm of Cu, 6 mL of hydrofluoric acid of 50 mass % and 19 mL of the water, for 3 minutes. The wafer was subjected to the oxidation treatment to be immersed in ozone water containing ozone at concentration of 5.0 ppm for 10 minutes in Example 35, while the wafer was not subjected to the oxidation treatment in Comparative Example 4.

In a similar manner to Experimental Example 3-1, the lifetime and the reflectance were measured for each wafer. Results are shown in Table 6.

TABLE 6

| | Condition of Porous Structure | Oxidation Treatment | | Lifetime | 600 nm Relative |
|---|---|---|---|---|---|
| | Making Process | Treatment Method | Treatment Condition | (μsec) | Reflectance (%) |
| Comparative Example 1 | No | No | — | 1.95 | 29.4 |
| Comparative Example 2 | Experimental Example 1 | No | — | 2.01 | 4.31 |
| Example 4 | Experimental Example 1 | Ozone Water | 5.0 ppm | 2.47 | 4.42 |
| Comparative Example 3 | Condition 2 | No | — | 1.99 | 4.42 |
| Example 34 | Condition 2 | Ozone Water | 5.0 ppm | 2.51 | 6.63 |
| Comparative Example 4 | Condition 3 | No | — | 2.10 | 10.2 |
| Example 35 | Condition 3 | Ozone Water | 5.0 ppm | 2.55 | 10.6 |

It can be seen from Table 6 that, under either one of the conditions of the porous structure making process, the process has reduced the reflectance and, by further carrying out the oxidation treatment, the lifetime was improved comparing to those where the oxidation treatment was not carried out.

The following is further reference experimental examples in which the oxidation treatment according to the present invention was not carried out and the condition of the porous structure making process was changed in a variety of manners.

Reference Experimental Example 1

Lower Alcohol Treatment

<Preparation of Sample>

Reference Example 1

First, a p-type (100) single crystal silicon wafer in 20 mm square was prepared and, by using the acid solution prepared by mixing hydrofluoric acid of 50 mass %/nitric acid of 70 mass %/the water=1:4:5 (the volume ratio), an etching treatment was carried out at the room temperature for 3 minutes, followed by drying the wafer. All subsequent steps were carried out at the room temperature. The wafer was immersed in 2-propanol (isopropyl alcohol; IPA) of 100 mass % for 10 minute. Then, the wafer was immersed in mixed solution of 10 mL of copper nitrate solution containing 1000 ppm of Cu, 10 mL of hydrofluoric acid of 50 mass % and 10 mL of the water, for 10 minutes. This process was carried out under a normal indoor environment, i.e., a light irradiation environment. Then, the wafer was immersed in nitric acid of 0.1 mass % for 5 minutes, thus the wafer for the solar cell was produced.

Reference Example 2

The wafer for the solar cell was produced in the same manner as Reference Example 1, except for using, in place of 2-propanol of 100 mass %, ethanol (ETOH) of 99 mass %, which is also lower alcohol.

Comparative Reference Example 1

The producing process of Reference Example 1 was carried out up to the step of the etching treatment by the acid solution prepared by hydrofluoric acid of 50 mass %/nitric acid of 70 mass %/the water=1:4:5 (the volume ratio), at the room temperature for 3 minutes. Then, the wafer was dried, thus the wafer for the solar cell was produced.

Comparative Reference Example 2

The wafer for the solar cell was produced in the same manner as Reference Example 1, except for skipping the step of immersing the wafer in 2-propanol of 100 mass % for 10 minutes (that is, the first step of the present invention was not carried out).

Comparative Reference Example 3

The wafer for the solar cell was produced in the same manner as Reference Example 1, except for using, in place of 2-propanol of 100 mass %, hydrogen peroxide water of 30 mass %, which is not lower alcohol.

<Evaluation: Measurement of Reflectance>

The reflectance of each sample was measured by the method described above. The relative reflectances at wavelengths of 600 nm and 700 nm are shown in Table 7.

TABLE 7

|  | 600 nm Reflectance (%) | 700 nm Reflectance (%) |
| --- | --- | --- |
| Reference Comparative Example 1 | 26.59 | 25.34 |
| Reference Comparative Example 2 | 30.84 | 29.67 |
| Reference Comparative Example 3 | 28.75 | 27.59 |
| Reference Example 1 | 4.20 | 4.01 |
| Reference Example 2 | 4.44 | 4.49 |

Table 7 shows that the reflectances of Comparative Reference Examples 2 and 3 were slightly increased in comparison to that of Comparative Reference Example 1. On the other hand, the reflectances of Reference Examples 1 and 2 were significantly reduced in comparison to that of Comparative Reference Example 1. From those results, it was found that the porous structure making process according to the present invention can reduce the reflectance.

Reference Experimental Example 2

Relationship Between Lower Alcohol Treatment Time and Reflectance

<Preparation of Sample>

First, a p-type (100) single crystal silicon wafer in 20 mm square was prepared and, by using the acid solution prepared by mixing hydrofluoric acid of 50 mass %/nitric acid of 70 mass %/the water=1:4:5 (the volume ratio), an etching treatment was carried out at the room temperature for 3 minutes, followed by drying the wafer. All subsequent steps were carried out at the room temperature. The wafer was immersed in ethanol (ETOH) of 99 mass % for a predetermined time. Then, the wafer was immersed in the mixed solution of 10 mL of copper nitrate solution containing 1000 ppm of Cu, 10 mL of hydrofluoric acid of 50 mass % and 10 mL of the water, for 10 minutes. This process was carried out under a normal indoor environment, i.e., a light irradiation environment. Then, the wafer was immersed in nitric acid of 0.1 mass % for 5 minutes, thus the wafer for the solar cell was produced. Five different samples were prepared by setting the predetermined time described above to 0 minute, 1 minute, 3 minutes, 5 minutes and 10 minutes. Setting to 0 minute means that this step was not carried out.

<Evaluation: Measurement of Reflectance>

The reflection spectrum of each of the five samples was measured by the method described above. The relative reflectances at wavelengths of 600 nm and 700 nm are shown in Table 8.

TABLE 8

| Ethanol Treatment Time (min) | 600 nm Reflectance (%) | 700 nm Reflectance (%) | Note |
| --- | --- | --- | --- |
| 0 | 27.75 | 25.47 | Reference Comparative Example |
| 1 | 3.12 | 2.96 | Reference Example |
| 3 | 3.78 | 3.84 | Reference Example |
| 5 | 3.88 | 3.68 | Reference Example |
| 10 | 3.57 | 3.36 | Reference Example |

From Table 8, it was found that a sufficient ethanol treatment time is 1 minute and the effect of reducing the reflectance is maintained by the treatment time in a range of 10 minutes or less.

Reference Experimental Example 3

Relationship Between Concentration of Cu and Reflectance

<Preparation of Sample>

First, a p-type (100) single crystal silicon wafer in 20 mm square was prepared and, by using the acid solution prepared by mixing hydrofluoric acid of 50 mass %/nitric acid of 70 mass %/the water=1:4:5 (the volume ratio), an etching treatment was carried out at the room temperature for 3 minutes, followed by drying the wafer. All subsequent steps were carried out at the room temperature. The wafer was immersed in ethanol (ETOH) of 99 mass % for 1 minute. Then, the wafer was immersed in mixed solution of 10mL of copper nitrate solution containing dissolved Cu at predetermined concentration, 10mL of hydrofluoric acid of 50 mass % and 10mL of the water, for 3 minutes. This process was carried out under a normal indoor environment, i.e., a light irradiation environment. Then, the wafer was immersed in nitric acid of 0.1 mass % for 5 minutes, thus the wafer for the solar cell was produced. Seven different samples were prepared by setting the predetermined concentration (ppm) described above to 33.3, 83.3, 166.7, 250.0, 333.3, 500.0, and 666.7.

<Evaluation: Measurement of Reflectance>

The reflection spectrum of each of the seven samples was measured by the method described above. The relative reflectances at wavelengths of 600 nm and 700 nm are shown in FIG. 2(a) and FIG. 2(b), respectively. Both of FIGS. 2(a) and (b) show that the reflectance becomes minimum when the concentration of Cu is in a range of 100 to 400 ppm and the effect of reducing the reflectance is somewhat reduced when the concentration exceeds 400 ppm. Therefore, it was found that a high effect of reducing the reflectance can be obtained when the concentration of Cu is in the range of 100 to 400 ppm.

Reference Experimental Example 4

Relationship Between Concentration of Hydrofluoric Acid and Reflectance

<Preparation of Sample>

First, a p-type (100) single crystal silicon wafer in 20 mm square was prepared and, by using the acid solution prepared by mixing hydrofluoric acid of 50 mass % /nitric acid of 70 mass %/the water=1:4:5 (the volume ratio), an etching treatment was carried out at the room temperature for 3 minutes, followed by drying the wafer. All subsequent steps were carried out at the room temperature. The wafer was immersed in ethanol (ETOH) of 99 mass % for 1 minute. Then, the wafer was immersed in 25 mL of mixed solution of 5 mL of copper nitrate solution containing 1000 ppm of dissolved Cu, hydrofluoric acid at predetermined concentration and the water, for 3 minutes. This process was carried out under a normal indoor environment, i.e., a light irradiation environment. Then, the wafer was immersed in nitric acid of 0.1 mass % for 5 minutes, thus the wafer for the solar cell was produced. Five different samples were prepared by setting the predetermined concentration (mass %) described above to 1.7, 8.3, 16.7, 25.0, and 33.3.

<Evaluation: Measurement of Reflectance>

Figure 3:
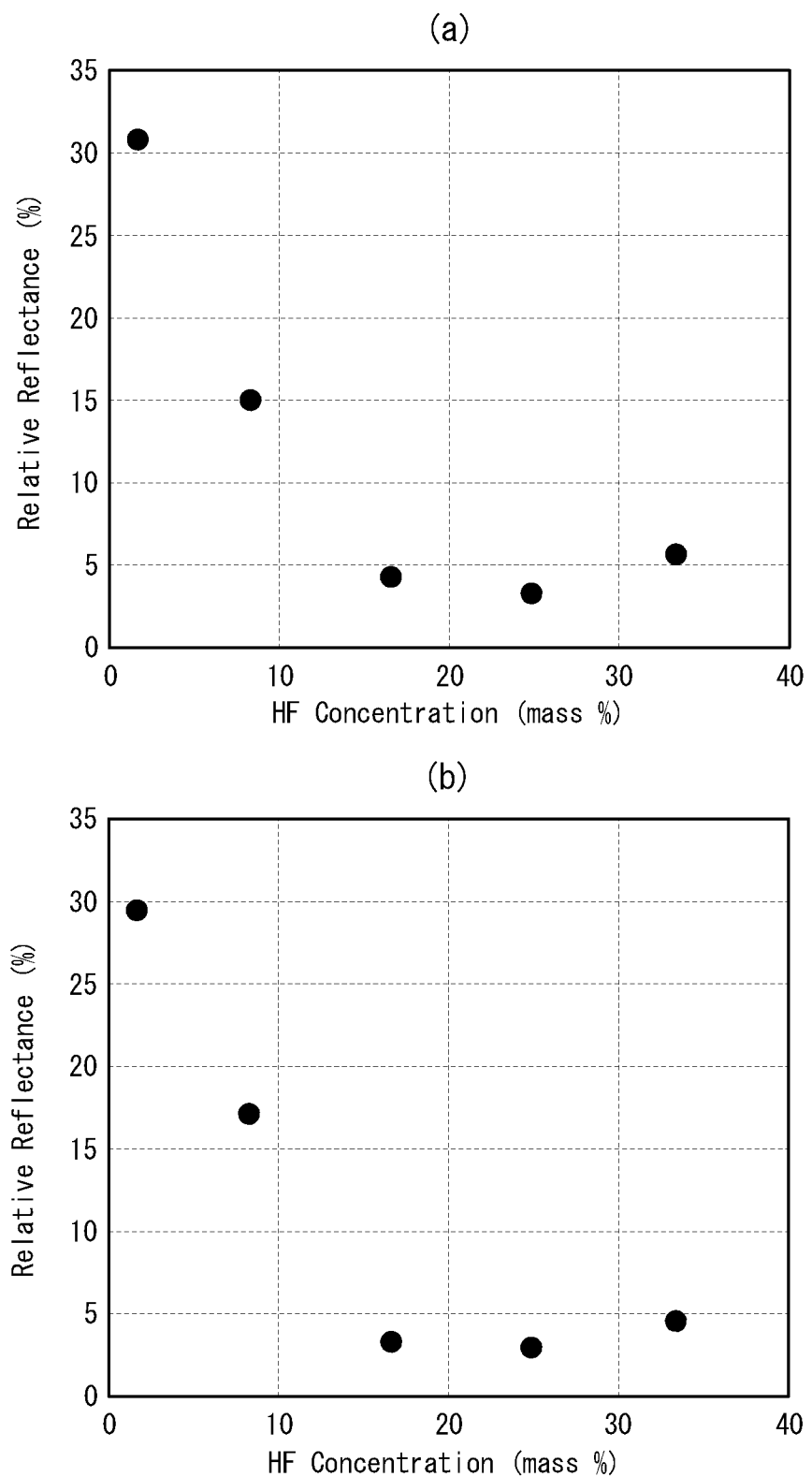
FIG. 3 illustrates graphs indicating, in Reference Example 4 of the present invention, a relationship between concentration of hydrofluoric acid at a second step and a relative reflectance of a silicon wafer surface.

The reflection spectrum of each of the five samples was measured by the method described above. The relative reflectances at wavelengths of 600 nm and 700 nm are shown in FIG. 3(a) and FIG. 3(b), respectively. Both of FIGS. 3(a) and (b) show that a high effect of reducing the reflectance can be obtained when the concentration of hydrofluoric acid is 10% or more.

Reference Experimental Example 5

Relationship Between Treatment Time of Second Step and Reflectance

<Preparation of Sample>

First, a p-type (100) single crystal silicon wafer in 20 mm square was prepared and, by using the acid solution prepared by mixing hydrofluoric acid of 50 mass %/nitric acid of 70 mass %/the water=1:4:5 (the volume ratio), an etching treatment was carried out at the room temperature for 3 minutes, followed by drying the wafer. All subsequent steps were carried out at the room temperature. The wafer was immersed in ethanol (ETOH) of 99 mass % for 1 minute. Then, the wafer was immersed in the mixed solution of 10 mL of copper nitrate solution containing 1000 ppm of dissolved Cu, 10 mL of hydrofluoric acid of 50 mass % and 10 mL of the water, for a predetermined time. This process was carried out under a normal indoor environment, i.e., a light irradiation environment. Then, the wafer was immersed in nitric acid of 0.1 mass % for 5 minutes, thus the wafer for the solar cell was produced. Seven different samples were prepared by setting the predetermined time described above to 0 minute, 1 minute, 3 minutes, 5 minutes, 10 minutes, 20 minutes and 30 minutes. Setting to 0 minute means that this step was not carried out.

<Evaluation: Measurement of Reflectance>

The reflection spectrum of each of the seven samples was measured by the method described above. The relative reflectances at wavelengths of 600 nm and 700 nm are shown in FIG. 4(a) and FIG. 4(b), respectively. Both of FIGS. 4(a) and (b) show that a low reflectance can be obtained when the treatment time is in a range of 1 to 30 minutes and a high effect of reducing the reflectance can be obtained when the treatment time is particularly in a range of 1 to 10 minutes.

<Summary of Reference Experimental Examples>

Although Reference Examples in which the oxidation treatment according to the present invention is not carried out and the condition of the porous structure making process is changed in a variety of manners are described above, since the oxidation treatment according to the present invention hardly changes the reflectance as mentioned above, it is considered that, when the samples in Reference Examples described above are subjected to the oxidation treatment, approximately the same reflectance can be obtained and, further, the oxidation treatment improves the lifetime.

Industrial Applicability

According to the present invention, a wafer surface is made fine porous and thereby reflectance of incident light on the wafer surface is sufficiently reduced and, further, a solar cell with higher conversion efficiency can be produced by using the obtained wafer for the solar cell.

The invention claimed is:

1. A method of producing a wafer for a solar cell comprising:
a first step of contacting lower alcohol to at least one surface of a semiconductor wafer; and a second step, after the first step, of contacting hydrofluoric acid containing metal ion to the at least one surface of the semiconductor wafer, thereby the at least one surface of the semiconductor wafer is made porous; and a third step that is, after the second step, a step of contacting alkali solution to the at least one surface of the semiconductor wafer, a step of contacting acid solution containing hydrofluoric acid and nitric acid to the at least one surface of the semiconductor wafer, or a step of carrying out an oxidation treatment to the at least one surface of the semiconductor wafer.

2. The method of producing the wafer for the solar cell according to claim 1, wherein
the semiconductor wafer is a silicon wafer, and
the metal ion is an ion of metal nobler than Si.

3. The method of producing the wafer for the solar cell according to claim 1, comprising
after the second step and before the third step, a step of contacting, to the at least one surface of the semiconductor wafer, solution that removes metal deposited from the metal ion from the one surface.

4. The method of producing the wafer for the solar cell according to claim 1, wherein
when contacting the alkali solution or the acid solution at the third step, a thickness of a porous layer formed in the one surface is 50 to 400 nm.

5. The method of producing the wafer for the solar cell according to claim 1, wherein
pH of the alkali solution used at the third step is 9.0 to 14.0.

6. The method of producing the wafer for the solar cell according to claim 1, wherein
a time of contacting the alkali solution at the third step is 600 seconds or less.

7. The method of producing the wafer for the solar cell according to claim 1, wherein
in the acid solution, concentration of the hydrofluoric acid is 0.1 to 5.0 mass % and concentration of the nitric acid is 20 to 50 mass %.

8. The method of producing the wafer for the solar cell according to claim 1, wherein
a time of contacting the acid solution at the third step is 10 minutes or less.

9. The method of producing the wafer for the solar cell according to claim 1, wherein
the oxidation treatment is a treatment of contacting solution containing an oxidant to the at least one surface of the semiconductor wafer.

10. The method of producing the wafer for the solar cell according to claim 1, wherein
the oxidation treatment is a heat treatment to the at least one surface of the semiconductor wafer in an atmosphere containing oxygen.

11. The method of producing the wafer for the solar cell according to claim 1, wherein
the oxidation treatment is a treatment to form an oxide film on the at least one surface of the semiconductor wafer by a liquid phase growth method.

12. A method of producing a solar cell comprising:
in addition to the steps of the method of producing the wafer for the solar cell according to claim 1, a further step of producing a solar cell from the wafer for the solar cell.

13. A method of producing a solar cell module comprising:
in addition to the steps of the method of producing the solar cell according to claim 12, a further step of producing a solar cell module from the solar cell.

14. The method of producing the wafer for the solar cell according to claim 1, wherein pH of the alkali solution used at the third step is 9.0 to 14.0 and a time of contacting the alkali solution at the third step is 600 seconds or less.

15. The method of producing the wafer for the solar cell according to claim 1, wherein, in the acid solution, concentration of the hydrofluoric acid is 0.1 to 5.0 mass% and concentration of the nitric acid is 20 to 50 mass % and a time of contacting the acid solution at the third step is 10 minutes or less.

16. The method of producing the wafer for the solar cell according to claim 1, wherein the semiconductor wafer is a silicon wafer, and the metal ion is an ion of metal nobler than Si, and the method further comprises, after the second step and before the third step, a step of contacting, to the at least one surface of the semiconductor wafer, solution that removes metal deposited from the metal ion from the one surface.

* * * * *